(12) United States Patent
Pan et al.

(10) Patent No.: US 10,103,235 B2
(45) Date of Patent: Oct. 16, 2018

(54) GATE STRUCTURE WITH MULTIPLE SPACERS

(71) Applicant: TAIWAN SEMICONDUCTOR MANUFACTURING CO., LTD., Hsinchu (TW)

(72) Inventors: Chia-Ming Pan, Tainan (TW); Chiang-Ming Chuang, Hemei Township (TW); Pei-Chi Ho, Xingang Township (TW); Ping-Pang Hsieh, Tainan (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 15/592,329

(22) Filed: May 11, 2017

(65) Prior Publication Data
US 2017/0243946 A1  Aug. 24, 2017

Related U.S. Application Data

(62) Division of application No. 14/815,386, filed on Jul. 31, 2015, now Pat. No. 9,653,302.

(51) Int. Cl.
*H01L 29/423* (2006.01)
*H01L 29/66* (2006.01)
*H01L 29/788* (2006.01)
*H01L 27/11521* (2017.01)

(52) U.S. Cl.
CPC .. *H01L 29/42328* (2013.01); *H01L 27/11521* (2013.01); *H01L 29/66553* (2013.01); *H01L 29/66825* (2013.01); *H01L 29/788* (2013.01)

(58) Field of Classification Search
CPC ......... H01L 21/28273; H01L 29/66825; H01L 29/788; H01L 27/11521; H01L 29/66553; H01L 29/42328
USPC ........................................................ 257/316
See application file for complete search history.

(56) References Cited

U.S. PATENT DOCUMENTS

| | | | |
|---|---|---|---|
| 2002/0009866 A1 | 1/2002 | Jang et al. | |
| 2002/0017680 A1 | 2/2002 | Na et al. | |
| 2004/0130947 A1 | 7/2004 | Fan et al. | |
| 2009/0098721 A1* | 4/2009 | Liu | H01L 27/11521 438/593 |
| 2011/0248328 A1 | 10/2011 | Shen et al. | |
| 2013/0076335 A1 | 3/2013 | Lin et al. | |

(Continued)

FOREIGN PATENT DOCUMENTS

TW  589674 B  6/2004

*Primary Examiner* — Fernando L Toledo
*Assistant Examiner* — Adam S Bowen
(74) *Attorney, Agent, or Firm* — Birch, Stewart, Kolasch & Birch, LLP

(57) ABSTRACT

Semiconductor structures are provided. The semiconductor structure includes a substrate and a floating gate structure formed over the substrate. The semiconductor structure further includes a dielectric structure formed over the floating gate structure and a control gate structure formed over the dielectric structure. The semiconductor structure further includes a first spacer formed over a lower portion of a sidewall of the control gate structure and an upper spacer formed over an upper portion of the sidewall of the control gate structure. In addition, a portion of the control gate structure is in direct contact with the upper spacer.

20 Claims, 10 Drawing Sheets

(56) References Cited

U.S. PATENT DOCUMENTS

2013/0234226 A1 9/2013 Shen et al.
2015/0137207 A1 5/2015 Chuang et al.

* cited by examiner

GATE STRUCTURE WITH MULTIPLE SPACERS

CROSS REFERENCE TO RELATED APPLICATIONS

This application is a Divisional application of U.S. patent application Ser. No. 14/815,386, filed on Jul. 31, 2015, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
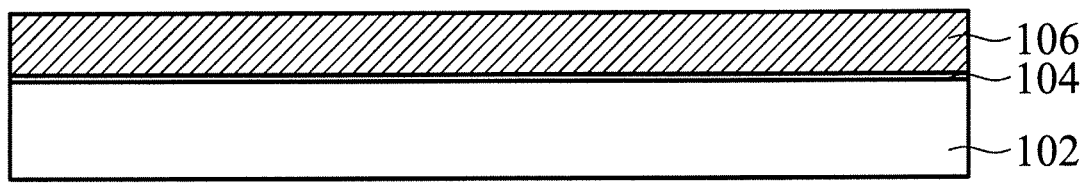
FIGS. 1A to 1P are cross-sectional representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for manufacturing the same are provided. The semiconductor structure includes a floating gate structure, and a control gate structure formed over the floating gate structure. Although spacers are formed on the sidewalls of the floating gate structure and the control gate structure, some portions of the spacers may be removed during sequential processes. Therefore, additional spacers are formed to protect the floating gate structure and the control gate structure so that the electronic leakage can be prevented.

Figure 1B:
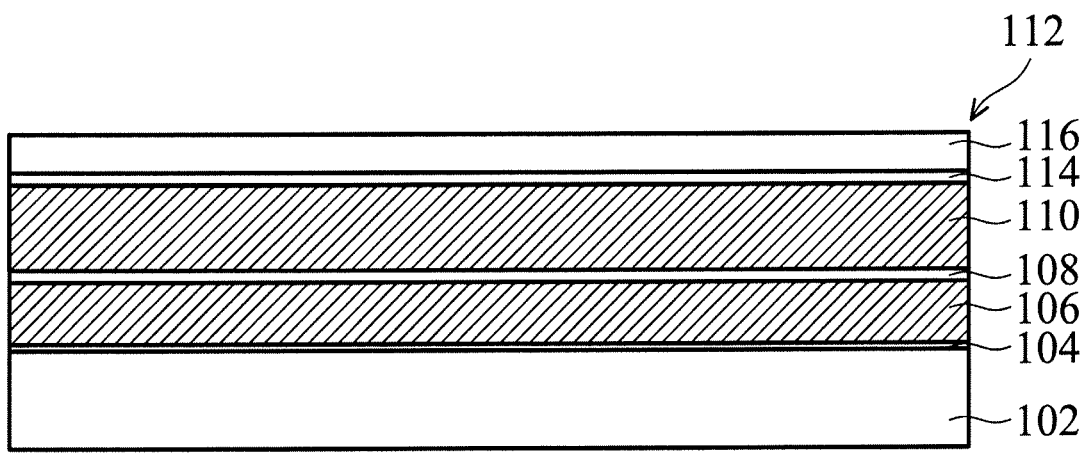
Figure 1C:
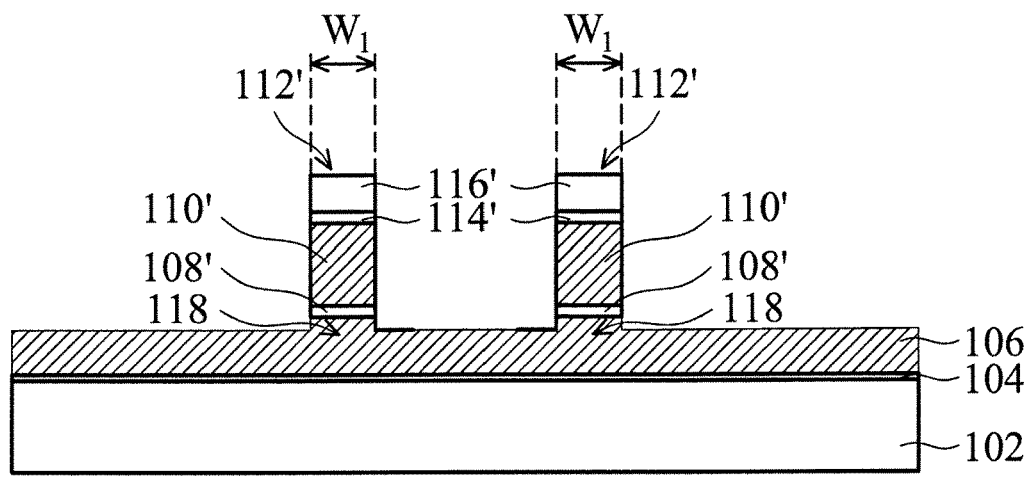
Figure 1D:
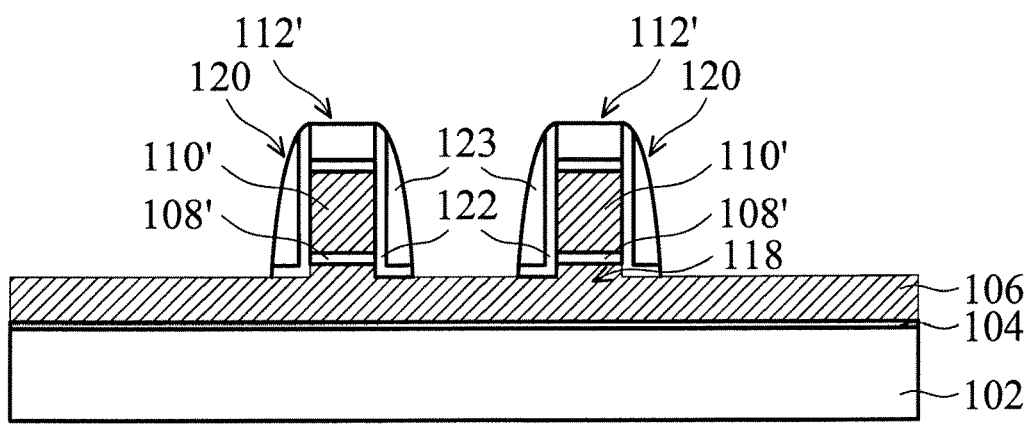
Figure 1E:
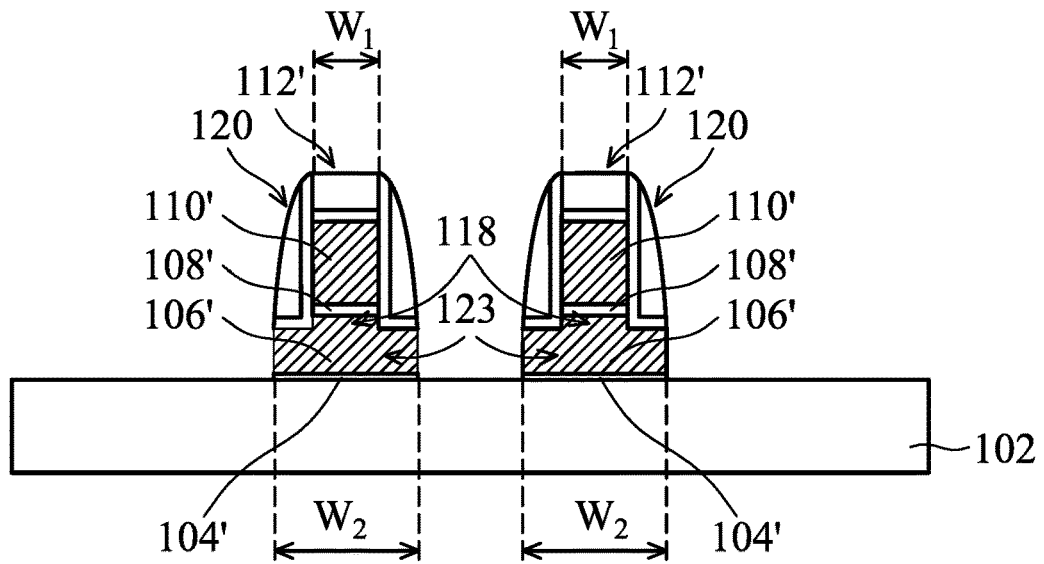
Figure 1F:
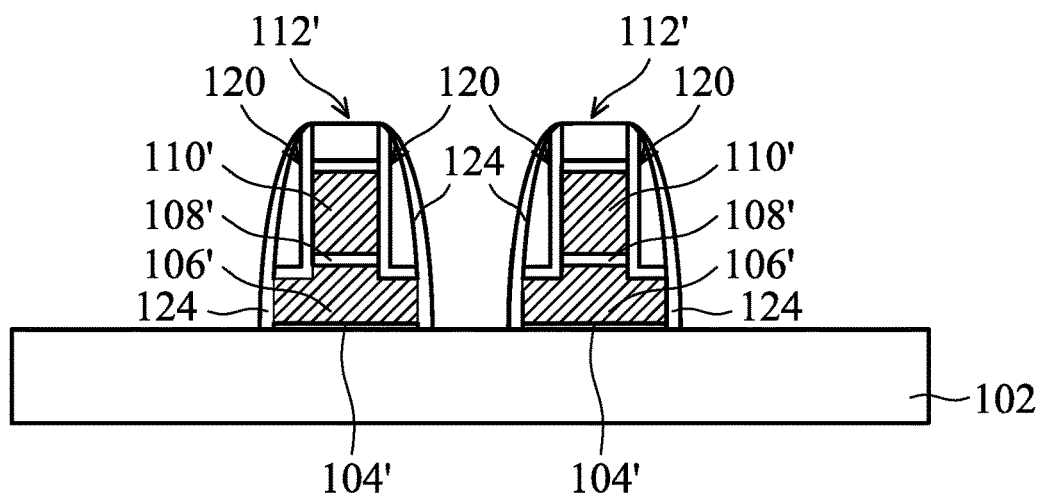
Figure 1G:
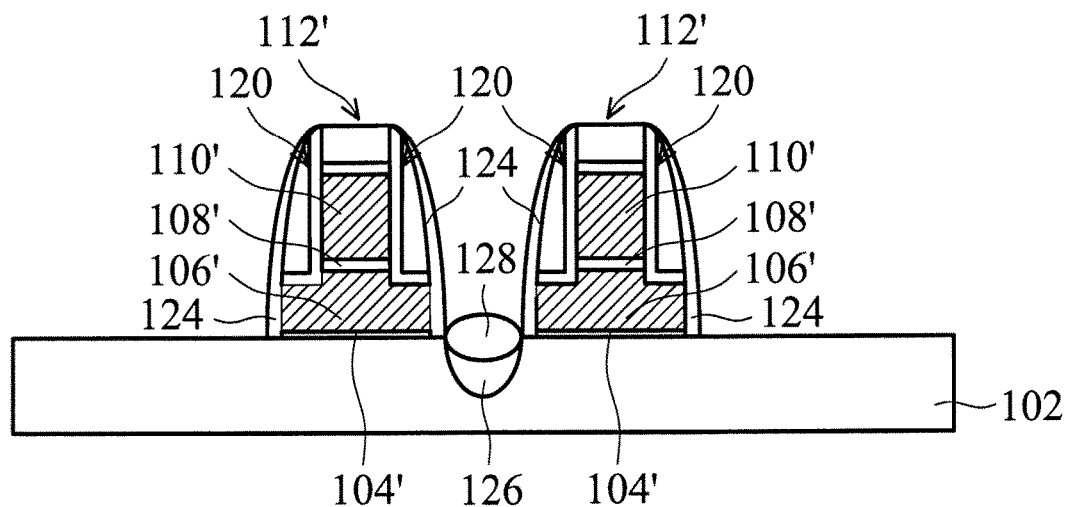
Figure 1H:
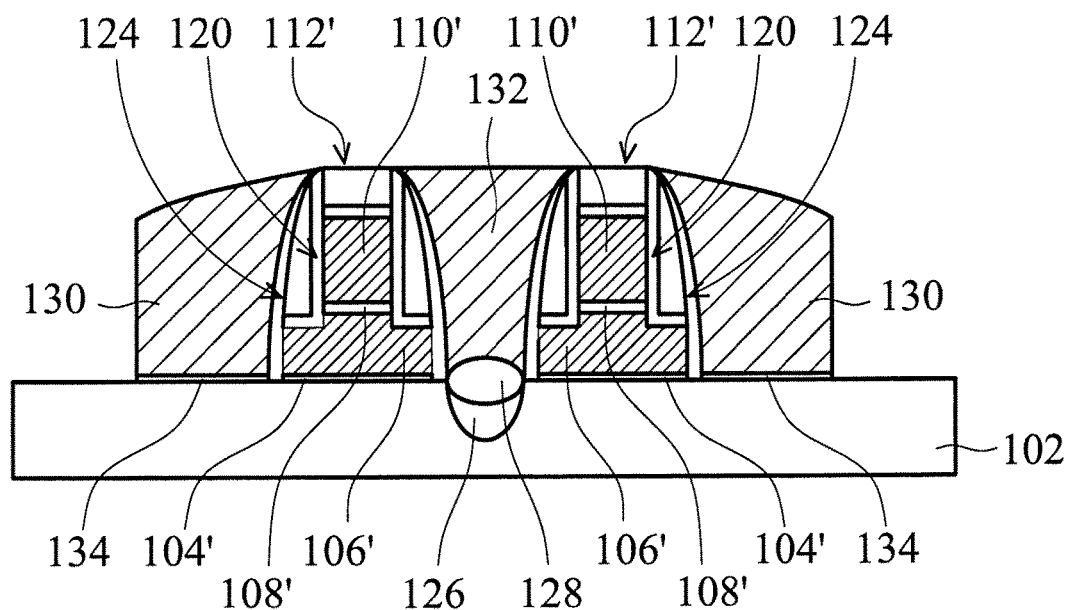
Figure 1I:
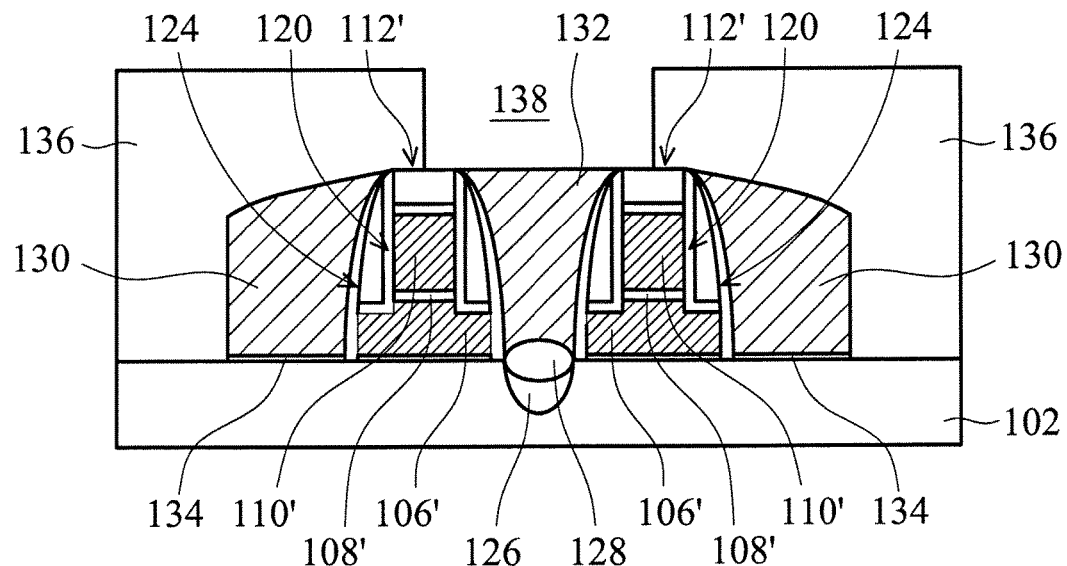
Figure 1J:
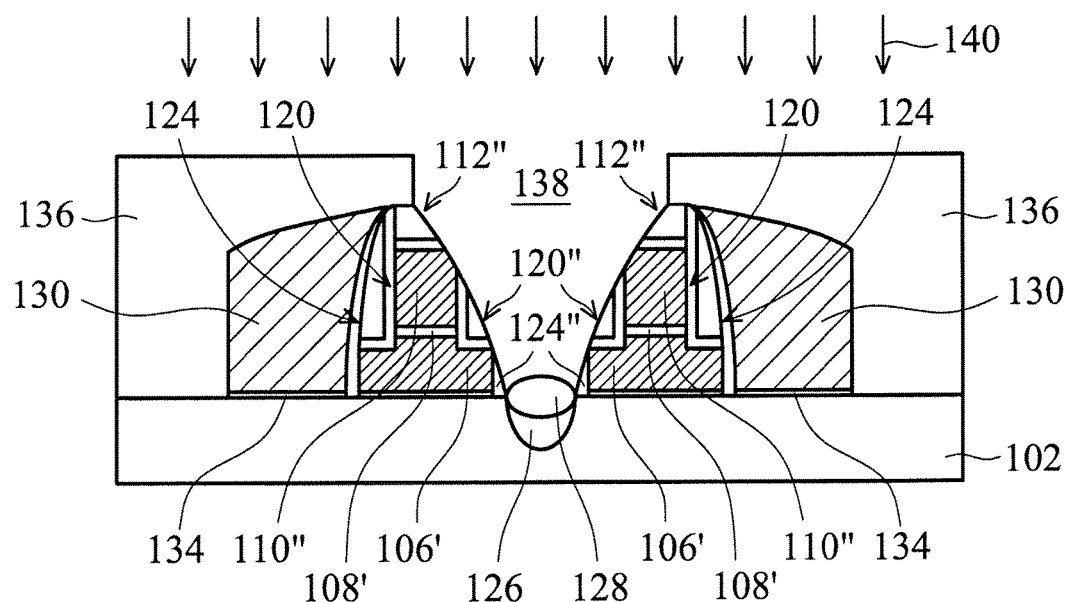
Figure 1K:
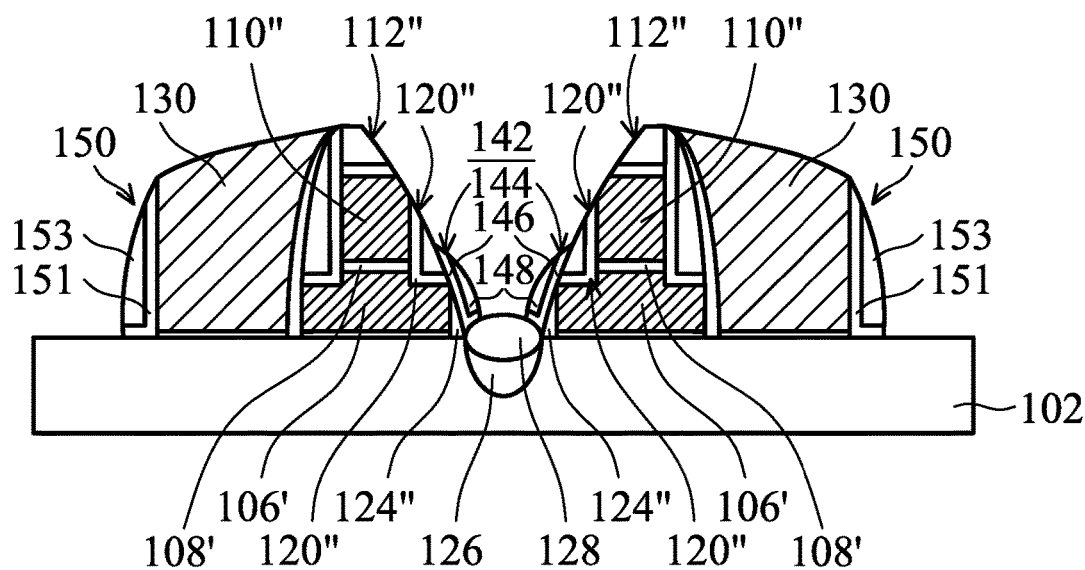
Figure 1L:
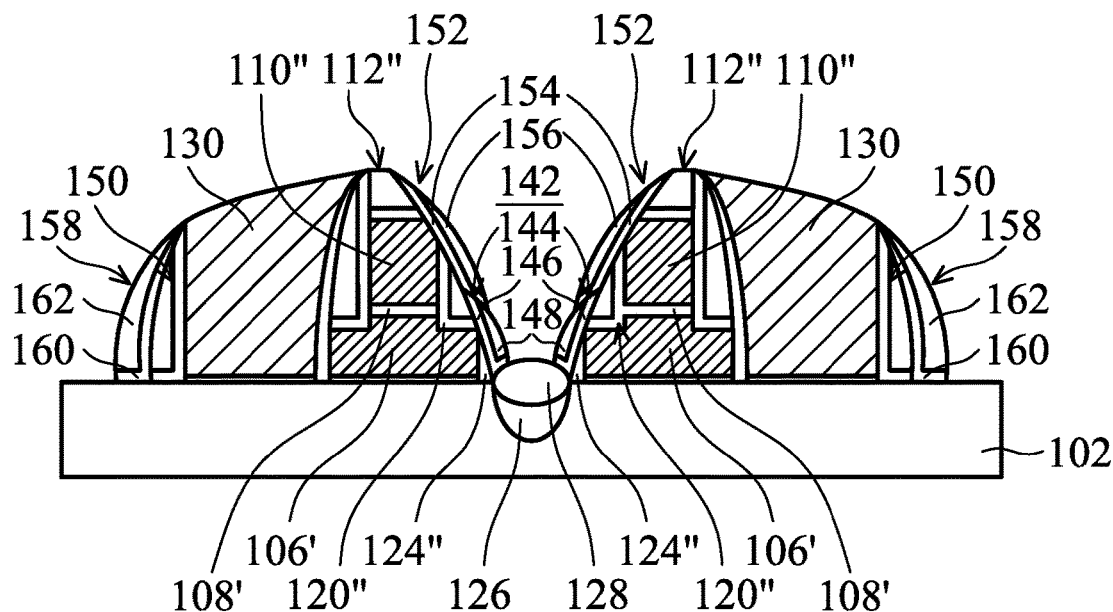
Figure 1M:
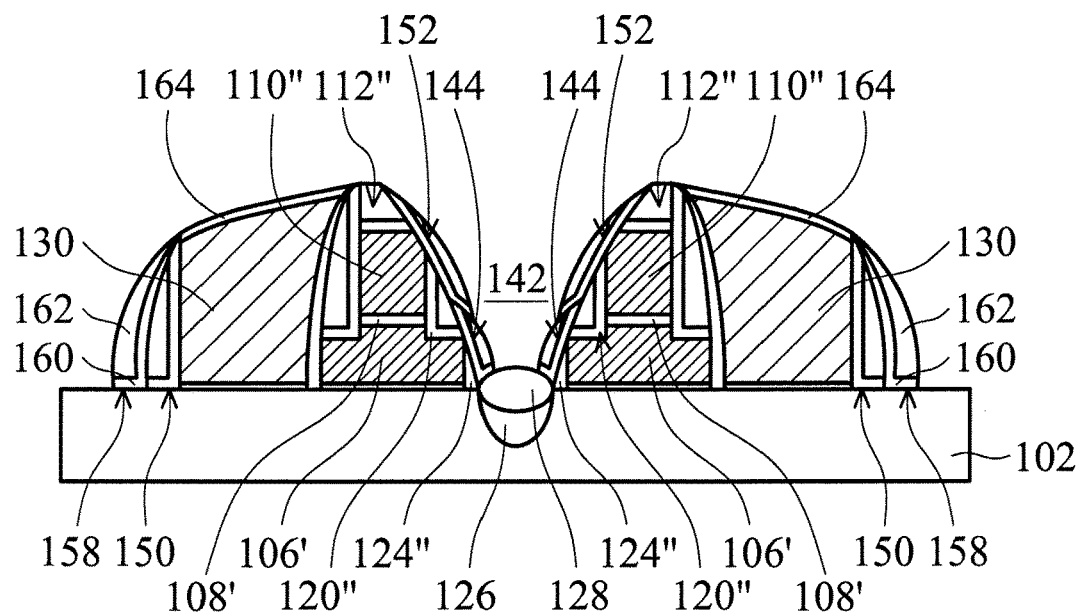
Figure 1N:
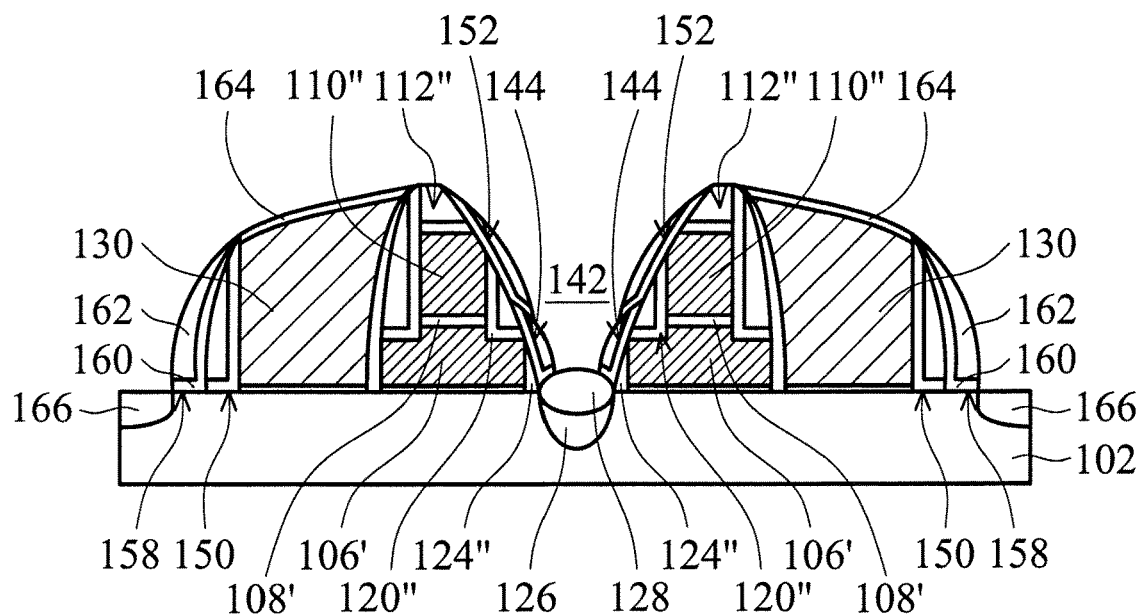
Figure 1O:
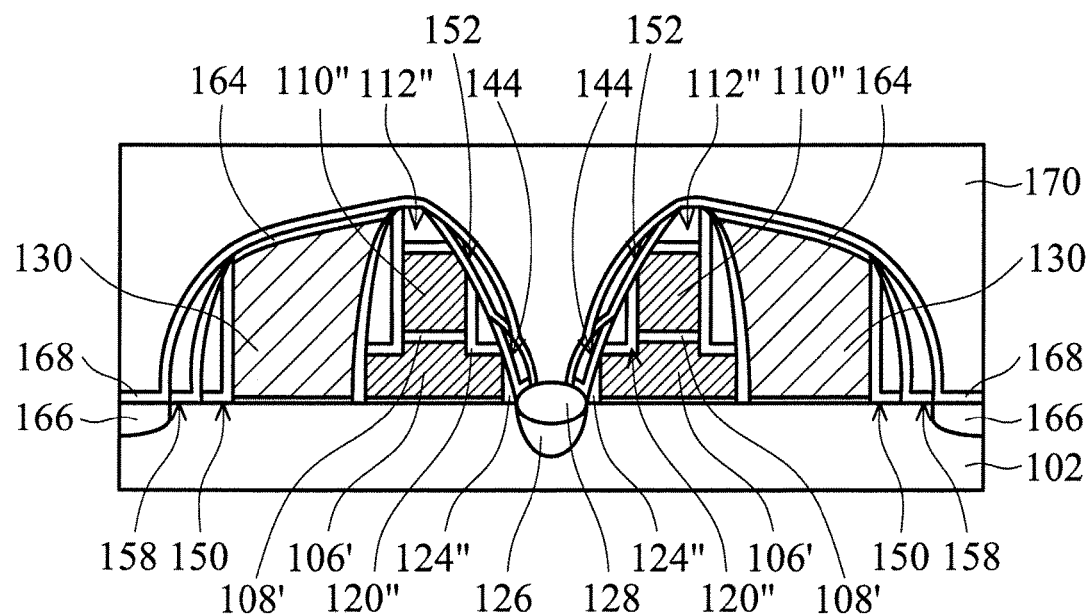
Figure 1P:
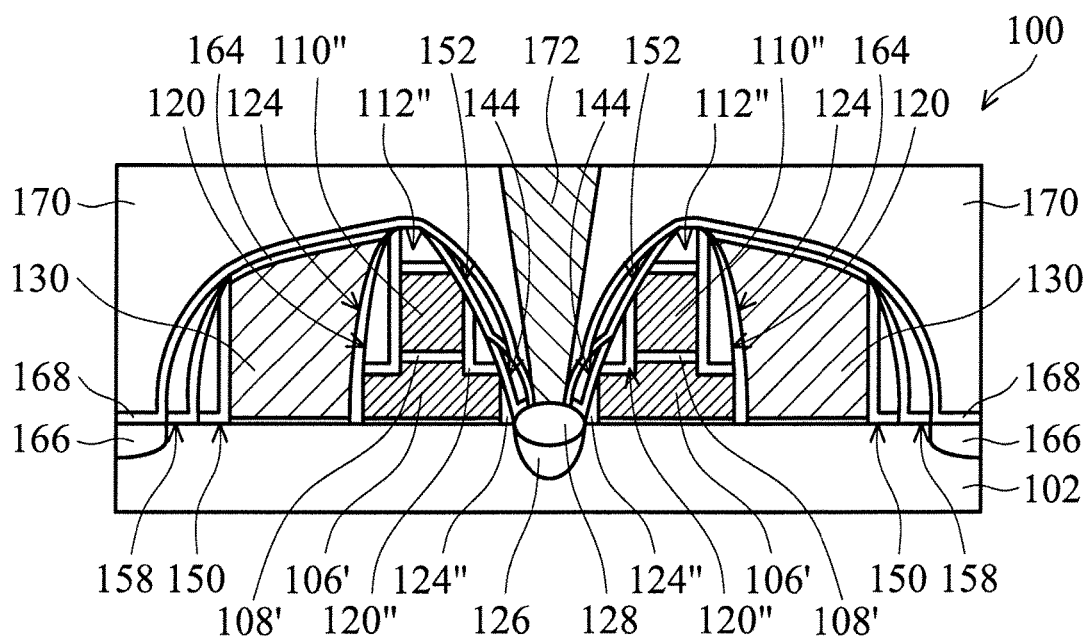

FIGS. 1A to 1P are cross-sectional representations of various stages of forming a semiconductor structure 100 in accordance with some embodiments. As shown in FIG. 1A, a substrate 102 is received in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, conductive features, and/or isolation structures. Furthermore, substrate 102 may further include single or multiple material layers to be patterned. For example, the material layers may include a silicon layer, a dielectric layer, and/or a doped poly-silicon layer.

A dielectric layer 104 is formed over substrate 102 in accordance with some embodiments. In some embodiments, dielectric layer 104 is made of high-k dielectric materials, such as metal oxides, metal nitrides, metal silicates, transition metal-oxides, transition metal-nitrides, transition metal-silicates, or oxynitrides of metals. Examples of the high-k dielectric materials include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, and hafnium dioxide-alumina ($HfO_2$—$Al_2O_3$) alloy. In some embodiments, dielectric layer 104 is formed by chemical vapor deposition (CVD), physical vapor deposition (PVD), atomic layer deposition (ALD), high density plasma CVD (HDPCVD), metal organic CVD (MOCVD), plasma enhanced CVD (PECVD), or a thermal process such as a furnace deposition.

A floating gate layer 106 is formed over dielectric layer 104, as shown in FIG. 1A in accordance with some embodiments. In some embodiments, floating gate layer 106 is made of polysilicon. Floating gate layer 106 may be formed by a depositing process. In some embodiments, floating gate layer 106 is deposited by furnace deposition, CVD, PVD, ALD, HDPCVD, MOCVD, or PECVD.

After floating gate layer 106 is formed, a dielectric layer 108 is formed over floating gate layer 106, as shown in FIG. 1B in accordance with some embodiments. In some embodiments, dielectric layer 108 includes multiple layers, such as an oxide layer, a nitride layer formed over the oxide layer, and another oxide layer formed over the nitride layer. Dielectric layer 108 may be formed by CVD, although other applicable deposition processes may alternatively or additionally be used.

Next, a control gate layer 110 is formed over dielectric layer 108, as shown in FIG. 1B in accordance with some embodiments. In some embodiments, control gate layer 110 is made of polysilicon. Control gate layer 110 may be formed by a deposition process. In some embodiments, control gate layer 110 is deposited by furnace deposition, CVD, PVD, ALD, HDPCVD, MOCVD, or PECVD.

After control gate layer 110 is formed, a cap layer 112 is formed over control gate layer 110, as shown in FIG. 1B in accordance with some embodiments. In some embodiments, cap layer 112 includes a nitride layer 114 and an oxide layer 116 formed over nitride layer 114. Cap layer 112 may be formed by CVD, although other applicable deposition processes may alternatively or additionally be used.

Afterwards, cap layer 112, control gate layer 110, and dielectric layer 108 are patterned to form a control gate structure 110', a cap structure 112' formed over control gate structure 110', and a dielectric structure 108' formed below control gate structure 110', as shown in FIG. 1C in accordance with some embodiments. In some embodiments, cap structure 112' includes nitride layer 114' and oxide layer 116'. In some embodiments, control gate structure 110' has a width $W_1$ in a range from about 150 nm to about 200 nm. In some embodiments, control gate structure has different widths at different portions. For example, the portion of control gate structure designed to be located next to a contact may have a greater width (e.g. width $W_1$) than other portions.

In some embodiments, after control gate structure 110' is formed, floating gate layer 106 is etched through control gate structure 110' to form a portion 118, as shown in FIG. 1C in accordance with some embodiments. As shown in FIG. 1C, the width of portion 118 is substantially equal to the width $W_1$ of control gate structure 110' in accordance with some embodiments.

Next, first spacers 120 are formed on the sidewalls of cap structure 112', control gate structure 110', dielectric structure 108, and portion 118, as shown in FIG. 1D in accordance with some embodiments. In addition, first spacers 120 are formed over the top surface of floating gate layer 106. In some embodiments, first spacer 120 includes an oxide layer 122 and a nitride layer 123 formed over oxide layer 122. As shown in FIG. 1D, first spacer 120 is formed on the sidewall of control gate structure 110' and on the top surface of floating gate layer 106.

After first spacers 120 are formed, floating gate layer 106 and dielectric layer 104 are patterned, as shown in FIG. 1E in accordance with some embodiments. Specifically, cap structure 112' and first spacer 120 are used as a mask when floating gate layer 106 is etched, such that a floating gate structure 106' is formed. As shown in FIG. 1E, floating gate structure 106' includes portion 118 and a bottom portion 123 in accordance with some embodiments. As described previously, portion 118 also has the width $W_1$ which is substantially equal to the width of control gate structure 110'. In addition, bottom portion 123 of floating gate structure 106' has a width $W_2$ which is substantially equal to the sum of the widths of first spacers 120 and control gate structure 110'.

In addition, dielectric layer 104 is also patterned to form dielectric structure 104', and the width of dielectric structure 104' is substantially equal to the width $W_2$ of bottom portion 122 of floating gate structure 106' in accordance with some embodiments.

Next, second spacers 124 are formed over first spacers 120 and over the sidewalls of floating gate structure 106', as shown in FIG. 1F in accordance with some embodiments. In some embodiments, second spacers 124 are made of oxide. Second spacers 124 may be formed by performing a deposition process and an etching process. As shown in FIG. 1F, an upper portion of second spacer 124 overlaps with first spacer 120, and second spacer 124 further extends onto the sidewall of floating gate structure 106'.

After second spacers 124 are formed, a common source region 126 is formed in substrate 102 adjacent to second spacers 124, as shown in FIG. 1G in accordance with some embodiments. Specifically, common source region 126 is formed between two adjacent floating gate structures 106', so that common source region 126 can be used by both two floating gate structures 106'. In some embodiments, an oxide 128 is formed over common source region 126.

After common source region 126 is formed between two adjacent floating gate structures 106', word line structures 130 and an erase gate structure 132 are formed, as shown in FIG. 1H in accordance with some embodiments. Specifically, erase gate structure 132 is formed between two adjacent floating gate structures 106' over common source region 126. In addition, word lines structures 130 are formed at the side of floating gate structures 106' opposite erase gate structure 132.

In some embodiments, dielectric layer 134 is formed below word line structures 130. In some embodiments, dielectric layer 134 is an oxide layer. Dielectric layer 134 may be formed by oxidizing substrate 102 before word line structures 130 are formed.

After word line structures 130 and erase gate structure 132 are formed, a photoresist structure 136 is formed over substrate 102, as shown in FIG. 1I in accordance with some embodiments. As shown in FIG. 1I, photoresist structure 136 has an opening 138, which exposes a portion of erase gate structure 132 and portions of cap structure 112' in accordance with some embodiments.

As shown in FIG. 1I, cap structure 112' has a width which is substantially equal to width $W_1$ of control gate structure 110', and the portion of cap structure 112' exposed by opening 138 in photoresist structure 136 has a width $W_3$. In some embodiments, the ratio of the width $W_1$ of the whole cap structure 112' to the width $W_3$ of the exposed portion of cap structure 112' is in a range from about 2:1 to about 2.5:1. The width $W_1$ to the width $W_3$ should be large enough to ensure that the portion of erase gate structure 132 exposed by opening 138 of photoresist structure 136 can be completely removed (Details will be described later).

After photoresist structure 136 is formed, an etching process 140 is performed, as shown in FIG. 1J in accordance with some embodiments. By performing etching process 140, the portion of erase gate structure 132 exposed by opening 138 of photoresist structure 136 is removed. In addition, portions of cap structure 112', first spacers 120, and second spacer 124 are also removed during etching process 140 in accordance with some embodiments.

As shown in FIG. 1J, during etching process 140, a portion of cap structure 112' is etched to form an etched cap structure 112", an upper portion of second spacer 124 is etched to form an etched second spacer 124", and an upper portion of first spacer 120 is etched to form an etched first spacer 120" in accordance with some embodiments. In addition, since some portions of cap structure 112' formed over control gate structure 110' and some portions of first spacer 120 and second spacer 124 formed on the sidewall of control gate structure 110' are removed, a portion of control gate structure 110' may be exposed during etching process 140. Therefore, a portion of control gate structure 110' is also removed to form an etched control gate structure 110" during etching process 140 in accordance with some embodiments.

Specifically, as shown in FIG. 1J, etched cap structure 112" is located over etched control gate structure 110", and etched first spacer 120" covers the lower portion of the sidewall of etched control gate structure 110". Etched second spacer 124" covers the sidewall of floating gate structure 106'. In some embodiments, etched spacer 124" further extends onto etched first spacer 120". As shown in FIG. 1J, a portion of etched control gate structure 110" is exposed after etching process 140 is performed. Therefore, etched control gate structure 110" may need to be protected in subsequent processes, or the risks of short circuit may increase (Details will be described later).

In some embodiments, etching process 140 is a wet etching process. After etching process 140 is performed, photoresist structure 136 is removed, and a trench 142 is formed in erase gate structure 132 between two adjacent floating gate structure 106' (or between two adjacent control gate structures 110') over common source region 126, as shown in FIG. 1K in accordance with some embodiments. It should be noted that, only the portion of erase gate structure 132 exposed by opening 138 is removed by performing etching process 140, other portions of erase gate structure 132 are covered by photoresist structure 136 during etching process 140 and are not removed, although not shown in FIG. 1K. That is, trench 142 is formed in erase gate structure 132 by removing the portion of erase gate structure 132 exposed by opening 138.

After trench 142 is formed, lower spacers 144 are formed on lower portions of the sidewall of trench 142, as shown in FIG. 1K in accordance with some embodiments. In some embodiments, lower spacers 144 are formed over etched second spacers 124". In some embodiments, lower spacers 144 are formed over etched second spacers 124" and extend onto the lower portion of etched first spacers 120". In some embodiments, lower spacers 144 include an oxide layer 146 and a nitride layer 148 formed over oxide layer 146.

In addition, third spacers 150 are formed on the sidewall of word line structures 130, as shown in FIG. 1K in accordance with some embodiments. In some embodiments, third spacers 150 include an oxide layer 151 and a nitride layer 153 formed over oxide layer 151. In some embodiments, lower spacers 144 and third spacers 150 are formed in the same deposition process and patterning process.

Afterwards, upper spacers 152 are formed over lower spacers 144, as shown in FIG. 1L in accordance with some embodiments. In some embodiments, upper spacers 152 are formed on the upper portion of the sidewall of trench 142. In some embodiments, upper spacers 152 are formed over the top portion of lower spacers 144. In some embodiments, upper spacers 152 are formed over the upper portion of etched first spacers 120" and extend onto the sidewall of etched cap structures 112". In addition, upper spacers 152 also extend over the portions of the sidewall of etched control gate structures 110" which are exposed after etching process 140 is performed. As shown in FIG. 1L, upper spacers 152 are in direct contact with etched control gate structures 110" in accordance with some embodiments. Accordingly, the exposed portion of etched control gate structures 110" are protected by upper spacer 152. In some embodiments, upper spacers 152 include an oxide layer 154 and a nitride layer 156 formed over oxide layer 154.

In addition, fourth spacers 158 are formed on third spacers 150, as shown in FIG. 1L in accordance with some embodiments. In some embodiments, fourth spacers 158 include an oxide layer 160 and a nitride layer 162 formed over oxide layer 160. In some embodiments, upper spacers 152 and fourth spacers 158 are formed in the same deposition process and patterning process.

After lower spacers 144 and upper spacers 152 are formed to protect etched control gate structures 110", a silicide layer 164 is formed over word line structure 130, as shown in FIG. 1M in accordance with some embodiments. Silicide layer 164 may be formed by forming a metal layer over word line structures 130, reacting word line structures 130 with the metal layer to form silicide layer 164, and removing the unreacted metal layer. As described previously, since lower spacers 144 and upper spacers 152 are formed on the sidewall of trench 142 to protect etched control gate structures 110", control gate structure 110" will not be exposed during the process for forming silicide layer 164, and therefore silicide layer will not be formed on etched control gate structures 110".

Next, drain regions 166 are formed in substrate 102 adjacent to fourth spacer 158, as shown in FIG. 1N in accordance with some embodiments. As shown in FIG. 1N, drain regions 166 are formed at the side of word line structures 130 opposite floating gate structures 106'.

After drain region 166 is formed, a contact etch stop layer 168 is formed over substrate 102 and conformally covers the structures formed over substrate 102, as shown in FIG. 1O in accordance with some embodiments. In some embodiments, contact etch stop layer 168 is made of silicon nitride, silicon oxynitride, and/or other applicable materials. Contact etch stop layer 168 may be formed by plasma enhanced CVD, low pressure CVD, ALD, or other applicable processes.

After contact etch stop layer 138 is formed, an interlayer dielectric layer 170 is formed on contact etch stop layer 138 over substrate 102 in accordance with some embodiments. Interlayer dielectric layer 170 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. Interlayer dielectric layer 170 may be formed by chemical vapor deposition (CVD), physical vapor deposition, (PVD), atomic layer deposition (ALD), spin-on coating, or other applicable processes.

Next, a contact 172 is formed through interlayer dielectric layer 170 to connect with common source region 126, as shown in FIG. 1P in accordance with some embodiments. In some embodiments, contact 172 includes conductive materials such as W, Cu, Ta, Ti, TaN, or TiN. Contact 172 may also include a barrier layer (not shown) formed on the sidewalls, and the barrier layer may be made of TaN, TiN, or CoW.

Figure 2:
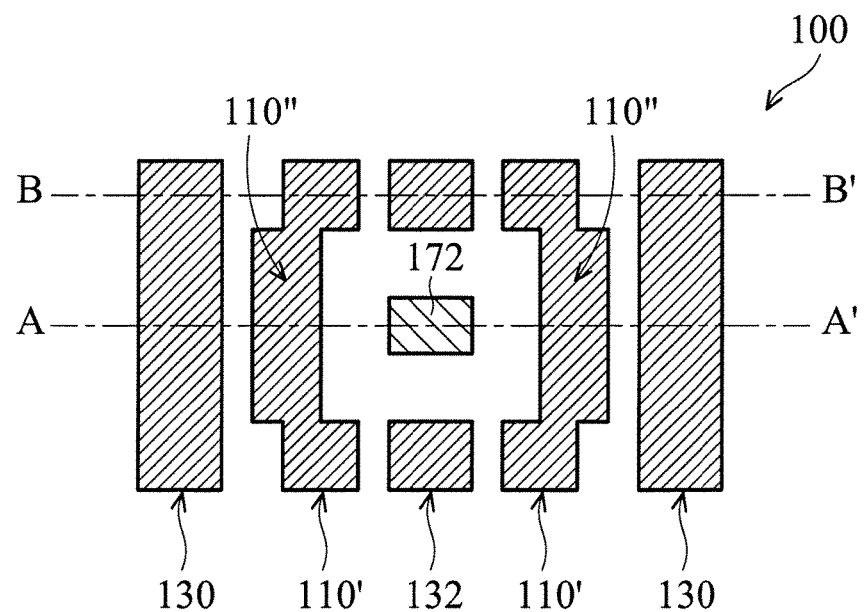
FIG. 2 a layout representation of the semiconductor structure shown in FIG. 1P in accordance with some embodiments.

FIG. 2 is a layout representation of semiconductor structure 100 shown in FIG. 1P in accordance with some embodiments. As described previously, semiconductor structure 100 includes floating gate structures 106' (not shown in FIG.

2), control gate structures 110', word line structures 130, and erase gate structure 132. Control gate structures 110' are formed over floating gate structures 106'. In addition, each control gate structure 110' has one word line structure 130 formed at one side and one erase gate structure 132 formed at the other side.

Furthermore, as described previously, some portion of erase gate structure 132 is removed to from contract 172 over common source region 126. The cross-sectional representation of semiconductor structure 100 shown in FIG. 1P may be the cross-sectional representation shown along line A-A' shown in FIG. 2 in accordance with some embodiments. As shown in FIG. 2, a portion of erase gate structure 132 is removed, and contact 172 is formed in the region that the removed portion originally located. In addition, during the process used to remove the portion of erase gate structure 132 (e.g. etching process 140), some portions of control gate structure 110' are also removed to form etched control gate structure 110" in accordance with some embodiments.

In some embodiments, before etching process 140 is performed, the portion of control gate structure 110' which is designed to be located adjacent to contact 172 formed thereafter may has a greater width than other portions. Accordingly, after etching process 140, the etched control gate structure 110" may still have enough width, as shown in FIG. 2 in accordance with some embodiments.

Figure 3:
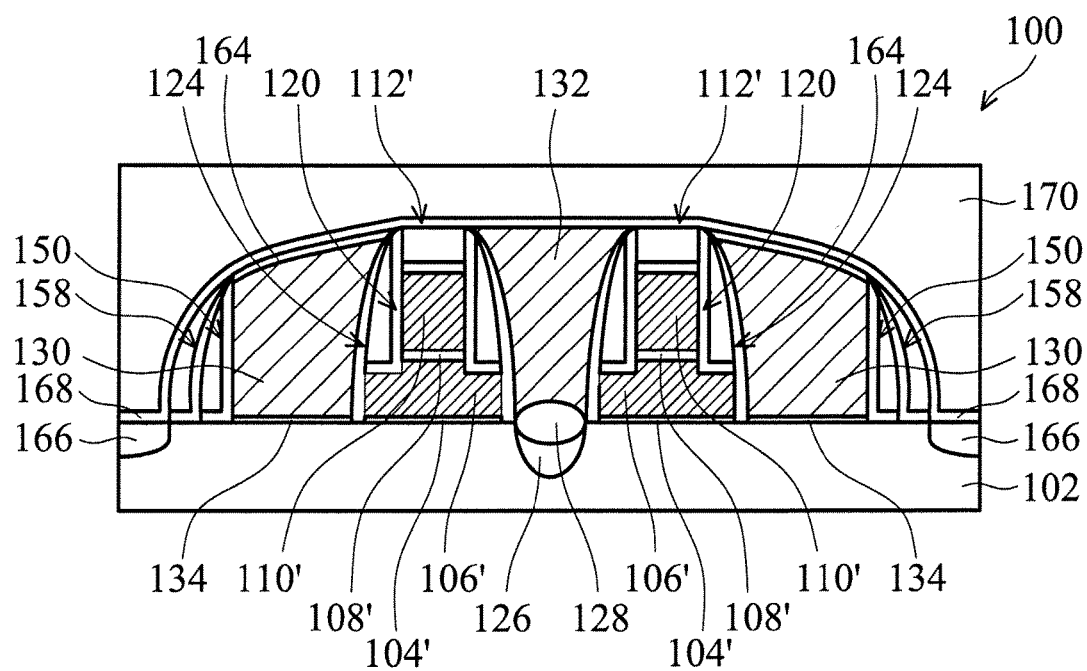
FIG. 3 is a cross-sectional representation of the semiconductor structure shown along line B-B' shown in FIG. 2 in accordance with some embodiments.

FIG. 3 is a cross-sectional representation of semiconductor structure 100 shown along line B-B' shown in FIG. 2 in accordance with some embodiments. As described previously, although erase gate structure 132 is not shown in FIG. 1P, it should be noted that only a portion of erase gate structure 132 is removed to form contact 172. As shown in FIG. 3, erase gate structure 132 remains located between two adjacent control gate structures 110' (and between two adjacent floating gate structures 106' in other parts of semiconductor structure 100.

As shown in FIGS. 1A to 1P and FIG. 3 and described previously, dielectric structure 108' is formed over floating gate structure 106', and control gate structure 110' is formed over dielectric structure 108'. In addition, cap structure 112' is formed over control gate structure 110'. First spacer 120 is formed at the sidewalls of control gate structure 110', and second spacer 124 is formed over first spacer 120 and the sidewall of floating gate structure 106'.

Next, common source region 126 is formed adjacent to floating gate structure 106'. Word line structure 130 is formed at a first side of floating gate structure 106' and control gate structure 110', and erase gate structure 132 is formed at a second side of floating gate structure 106' and control gate structure 110'. In some embodiments, erase gate structure 132 is formed over common source region 126.

After erase gate structure 132 is formed, trench 142 is formed in erase gate structure 132 adjacent to the second side of floating gate structure 106' and control gate structure 110'. In some embodiments, trench 142 is formed by performing etching process 140. During etching process 140, some portions of cap structure 112', first spacer 120, second spacer 124, and control gate structure 110' are removed to form etched cap structure 112", etched first spacer 120", etched second spacer 124", and etched control gate structure 110".

Next, lower spacer 144 is formed at the lower portion of a sidewall of trench 142, and upper spacer 152 is formed at the upper portion of the sidewall of trench 142. As shown in FIG. 1P, lower spacer 144 (and upper spacer 152) and word line structure 130 are located at opposite sides of floating gate structure 106'.

As shown in FIG. 1P, lower spacer 144 is formed over etched second spacer 124" and extending onto etched first spacer 120". Accordingly, lower spacer 144 is positioned over etched second spacer 124" and over the lower portion of etched first spacer 120" in accordance with some embodiments. In some embodiments, lower spacer 144 is adjacent to common source region 126 formed in substrate 102.

As shown in FIG. 1P, upper spacer 152 is formed over etched first spacer 124" and extends onto etched control gate structure 110". Accordingly, etched first spacer 120" is positioned over the lower portion of the sidewall of etched control gate structure 110", and upper spacer 152 is positioned over the upper portion of the sidewall of etched control gate structure 110". In some embodiments, a portion of upper spacer 152 overlaps with etched first spacer 120". In some embodiments, a portion of etched control gate structure 110" is in direct contact with upper spacer 152. In some embodiments, upper spacer 152 further extends onto the sidewall of etched cap structure 112".

Afterwards, trench 142 is filled with interlayer dielectric layer 170 and contact 172 is formed through interlayer dielectric layer 170 over common source region 126.

Figure 4A:
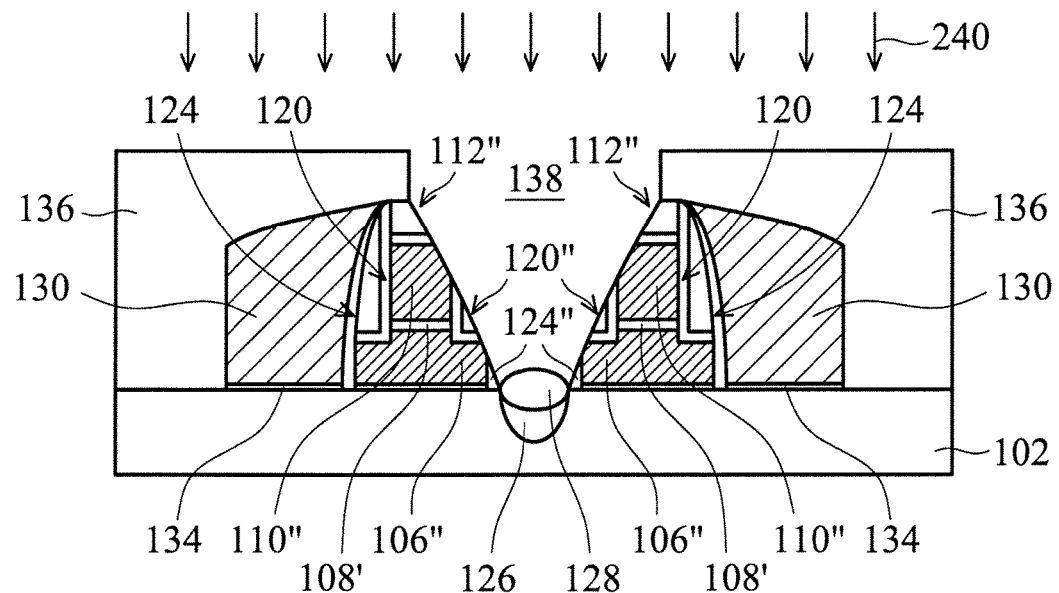
FIGS. 4A to 4B are cross-sectional representations of various stages of forming a semiconductor structure in accordance with some embodiments.
Figure 4B:
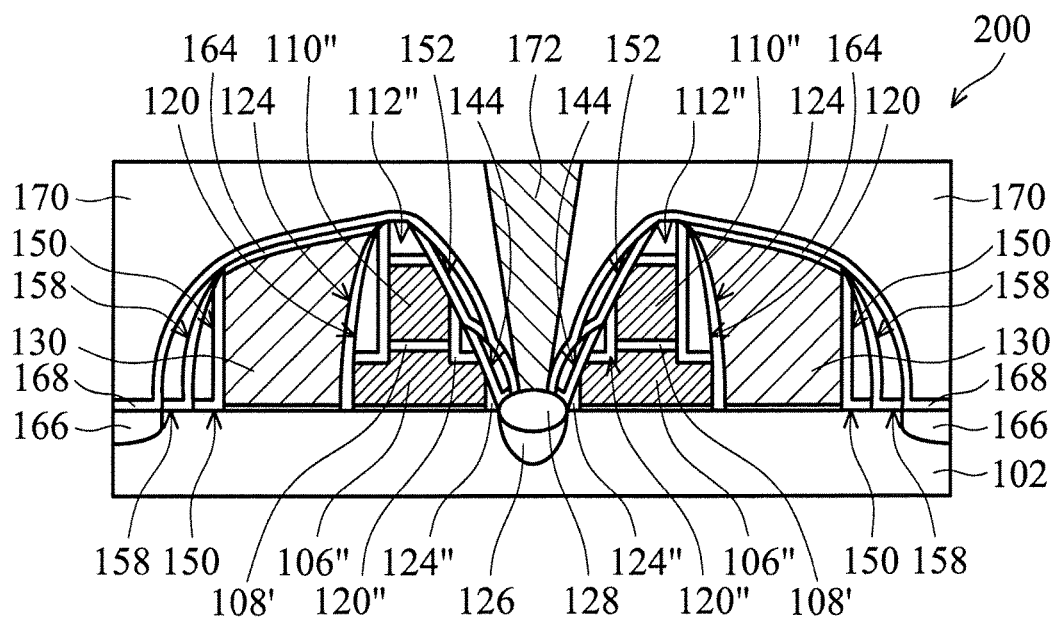

FIGS. 4A to 4B are cross-sectional representations of various stages of forming a semiconductor structure 200 in accordance with some embodiments. Semiconductor structure 200 is substantially the same as, or similar to, semiconductor structure 100 described previously, except a portion of floating gate structure 106' is removed. Materials and processes used to form semiconductor structure 200 are similar to, or the same as, those used to form semiconductor structure 100 described previously and shown in FIGS. 1A to 3 and may not be repeated herein.

Specifically, processes shown in FIG. 1A to 1I and described previously are performed. Afterwards. an etching process 240 is performed through opening 138 of photoresist structure 136 to remove the portion of erase gate structure 132 exposed by opening 138 (not shown in FIG. 4A, referring to FIG. 1I). In addition, portions of cap structure 112', first spacers 120, second spacer 124, and control gate structure 110' (as shown in FIG. 1I) are also removed during etching process 240 to form etched cap structure 112", etched first spacers 120", etched second spacer 124", and etched control gate structure 110", as shown in FIG. 4A in accordance with some embodiments.

In addition, since some portions of second spacer 124 formed on the sidewall of floating gate structure 106' are removed, a portion of floating gate structure 106' may be exposed during etching process 240. Therefore, a portion of floating gate structure 106' is also removed to form an etched floating gate structure 106" after etching process 240 is performed in accordance with some embodiments. In some embodiments, etching process 240 is a wet etching process.

After etching process 240 is performed, photoresist structure 136 is removed, and lower spacers 144, third spacers 150, upper spacers 152, fourth spacers 158, drain regions 166, contact etch stop layer 168, interlayer dielectric layer 170, and contact 172 are formed as shown in FIG. 4B in accordance with some embodiments.

As shown in FIG. 4B, although etched second spacer 124" does not fully cover the sidewall of etched floating gate structure 106", etched floating gate structure 106" is protected by lower spacer 144 formed afterwards. Accordingly, risk of short circuit can be prevented. In some embodiments, lower spacer 144 is in direct contact with etched floating gate structure 106". As shown in FIG. 4B, etched second spacer 124" is formed on the lower portion of the sidewall of etched floating gate structure 106" and is in direct contact with the lower portion of the sidewall of etched floating gate structure 106", and lower spacer 144 is formed on the upper portion of etched floating gate structure 106" and is in direct contact with the upper portion of etched floating gate structure 106" in accordance with some embodiments.

As described previously, a portion of floating gate structure 106' is removed during etching process 240, and etched floating gate structure 106" is formed accordingly. Lower spacer 144 is formed over etched second spacer 124" and extends onto the sidewall of exposed etched floating gate structure 106" to protect etched floating gate structure 106" in sequential processes. Therefore, a portion of lower spacer 144 is in direct contact with etched floating gate structure 106" in accordance with some embodiments.

Generally, spacers are formed to protect gate structures in sequential processes after the gate structures are formed. For example, first spacers 120 and second spacers 124 are formed over the sidewall of control gate structure 110' and floating gate structure 106'. However, when a portion of erase gate structure 132 is removed by etching process 140 to form contact 172 in the region, portions of first spacers 120 and second spacers 124 may also be removed by etching process 140. Therefore, some portion of control gate structure 110' and/or floating gate structure 106' may also be etched and exposed during etching process 140.

Accordingly, in some embodiments of the disclosure, lower spacer 144 and upper spacer 152 are formed respectively over the lower portion and the upper portion of the sidewall of trench 142 as a protection for the control gate structure and floating gate structure (e.g. etched control gate structure 110" and/or etched floating gate structure 106"). As a result, in sequential processes, such as process for forming silicide layer 164, the control gate structure and floating gate structure will not be exposed and/or damaged by the processes. Therefore, risk of short circuit or electron leakage can be reduced. Accordingly, the yield of manufacturing of the semiconductor structures with multiple spacers, such as semiconductor structures 100 and 200, can be improved.

Embodiments of semiconductor structures and methods for manufacturing the same are provided. The semiconductor structure includes a floating gate structure, a dielectric structure formed over the floating gate structure, and a control gate structure formed over the dielectric structure. A first spacer is formed over the lower portion of the sidewall of the control gate structure, and an upper spacer is formed over the upper portion of the sidewall of the control gate structure. The first spacer and the upper spacer may be seen as a protection of the control gate structure to prevent electron leakage of the semiconductor structure. Therefore, the yield of forming the semiconductor structure can be improved.

In some embodiments, a semiconductor structure is provided. The semiconductor structure includes a substrate and a floating gate structure formed over the substrate. The semiconductor structure further includes a dielectric structure formed over the floating gate structure and a control gate structure formed over the dielectric structure. The semiconductor structure further includes a first spacer formed over a lower portion of a sidewall of the control gate structure and an upper spacer formed over an upper portion of the sidewall of the control gate structure. In addition, a portion of the control gate structure is in direct contact with the upper spacer.

In some embodiments, a semiconductor structure is provided. The semiconductor structure includes a floating gate structure formed over a substrate and a dielectric structure formed over the floating gate structure. The semiconductor structure further includes a control gate structure formed over the dielectric structure and a first spacer formed over a sidewall of the control gate structure. The semiconductor structure further includes a second spacer formed over a sidewall of the floating gate structure and a lower spacer formed over the second spacer. The semiconductor structure further includes an upper spacer formed over the first spacer and extending onto the control gate structure. In addition, the upper spacer is in direct contact with the control gate structure.

In some embodiments, a semiconductor structure is provided. The semiconductor structure includes a substrate and a floating gate structure formed over the substrate. The semiconductor structure further includes a dielectric structure formed over the floating gate structure and a control gate structure formed over the dielectric structure. The semiconductor structure further includes a first spacer formed over a lower portion of a sidewall of the control gate structure and an upper spacer formed over an upper portion of the sidewall of the control gate structure and overlapping with the first spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a floating gate structure formed over the substrate;
   a dielectric structure formed over the floating gate structure;
   a control gate structure formed over the dielectric structure;
   a first spacer formed over a lower portion of a sidewall of the control gate structure; and
   an upper spacer formed over a slope upper portion of the sidewall of the control gate structure,
   wherein a portion of the control gate structure is in direct contact with the upper spacer.

2. The semiconductor structure as claimed in claim 1, wherein a portion of the upper spacer overlaps with the first spacer.

3. The semiconductor structure as claimed in claim 1, further comprising:
   a second spacer formed over the first spacer and over a sidewall of the floating gate structure.

4. The semiconductor structure as claimed in claim 3, further comprising:
   a lower spacer formed over the second spacer and over a lower portion of the first spacer.

5. The semiconductor structure as claimed in claim 4, wherein a portion of the lower spacer is in direct contact with the floating gate structure.

6. The semiconductor structure as claimed in claim 4, further comprising:
   a common source region formed adjacent to the lower spacer in the substrate; and
   a contact formed over the common source region.

7. The semiconductor structure as claimed in claim 6, further comprising:
a word line structure formed at a side of the floating gate structure opposite the contact.

8. A semiconductor structure, comprising:
a floating gate structure formed over a substrate;
a dielectric structure formed over the floating gate structure;
a control gate structure formed over the dielectric structure;
a first spacer formed over a sidewall of the control gate structure;
a second spacer formed over a sidewall of the floating gate structure;
a lower spacer formed over the second spacer; and
an upper spacer formed over the first spacer and extending onto the control gate structure,
wherein the upper spacer is in direct contact with the control gate structure, and the lower spacer is in direct contact with the floating gate structure.

9. The semiconductor structure as claimed in claim 8, further comprising:
a common source region formed adjacent to the lower spacer in the substrate; and
a contact formed over the common source region.

10. The semiconductor structure as claimed in claim 8, further comprising:
a cap structure formed over the control gate structure,
wherein the upper spacer further extends onto a sidewall of the cap structure.

11. The semiconductor structure as claimed in claim 8, further comprising:
a word line structure formed over the substrate,
wherein the word line structure and the lower spacer are located at opposite sides of the floating gate structure.

12. A semiconductor structure, comprising:
a substrate;
a floating gate structure formed over the substrate;
a dielectric structure formed over the floating gate structure;
a control gate structure formed over the dielectric structure;
a first spacer formed over a lower portion of a sidewall of the control gate structure; and
an upper spacer formed over an upper portion of the sidewall of the control gate structure and vertically overlapping with the first spacer.

13. The semiconductor structure as claimed in claim 12, wherein the control gate structure is in direct contact with the upper spacer.

14. The semiconductor structure as claimed in claim 12, further comprising:
a second spacer formed over the first spacer and over a sidewall of the floating gate structure.

15. The semiconductor structure as claimed in claim 14, further comprising:
a lower spacer overlapping with both the second spacer and the first spacer.

16. The semiconductor structure as claimed in claim 15, wherein the lower spacer is in direct contact with the floating gate structure.

17. The semiconductor structure as claimed in claim 15, further comprising:
a common source region formed adjacent to the lower spacer in the substrate; and
a contact formed over the common source region.

18. The semiconductor structure as claimed in claim 17, further comprising:
a word line structure formed at a side of the floating gate structure opposite the contact.

19. The semiconductor structure as claimed in claim 17, wherein the lower spacer covers a portion of the common source region.

20. The semiconductor structure as claimed in claim 1, wherein the floating gate structure has a top portion and a bottom portion, and a width of the bottom portion of the floating gate structure is greater than a width of the top portion of the floating gate structure.

* * * * *